US010935708B2

(12) United States Patent
Lee et al.

(10) Patent No.: US 10,935,708 B2
(45) Date of Patent: Mar. 2, 2021

(54) RETARDATION FILM AND A DISPLAY APPARATUS INCLUDING THE SAME

(71) Applicant: SAMSUNG DISPLAY CO., LTD., Yongin-si (KR)

(72) Inventors: Heeyoung Lee, Yongin-si (KR); Suk Choi, Yongin-si (KR)

(73) Assignee: SAMSING DISPLAY CO., LTD, Yongin-si (KR)

( * ) Notice: Subject to any disclaimer, the term of this patent is extended or adjusted under 35 U.S.C. 154(b) by 220 days.

(21) Appl. No.: 15/604,911

(22) Filed: May 25, 2017

(65) Prior Publication Data

US 2017/0343713 A1 Nov. 30, 2017

(30) Foreign Application Priority Data

May 25, 2016 (KR) .................. 10-2016-0064235

(51) Int. Cl.
*G02B 5/30* (2006.01)
*H01L 27/32* (2006.01)
*H01L 51/52* (2006.01)

(52) U.S. Cl.
CPC ......... *G02B 5/3016* (2013.01); *G02B 5/3083* (2013.01); *H01L 27/3244* (2013.01); *C09K 2323/00* (2020.08); *C09K 2323/03* (2020.08); *H01L 51/5281* (2013.01); *H01L 2251/5338* (2013.01)

(58) Field of Classification Search
CPC .............. G02B 5/3016; H01L 51/5281; H01L 51/0097; H01L 27/3244; H01L 2251/5338; Y10T 428/10; Y10T 428/1036; C09K 2323/00
See application file for complete search history.

(56) References Cited

U.S. PATENT DOCUMENTS

| 7,443,585 | B2 | 10/2008 | Hara et al. |
| 8,274,627 | B2 | 9/2012 | Tomonaga et al. |
| 2004/0033321 | A1* | 2/2004 | Jakli ...................... C09K 19/02 428/1.3 |
| 2005/0057714 | A1* | 3/2005 | Jeon ................... G02F 1/133634 349/122 |

(Continued)

FOREIGN PATENT DOCUMENTS

| CN | 1650197 | 8/2005 |
| CN | 1806192 | 7/2006 |

(Continued)

*Primary Examiner* — Anthony J Frost
(74) *Attorney, Agent, or Firm* — F. Chau & Associates, LLC

(57) ABSTRACT

A retardation film including a stacked structure including 2m tilt +C plates with m as a positive integer and a +A plate disposed over the 2m tilt +C plates. Each of the 2m tilt +C plates includes a liquid crystal layer. The liquid crystal layer includes a material satisfying nx≠ny<nz, wherein a longitudinal direction axis of the retardation film is an X-axis, a width direction axis of the retardation film substantially perpendicular to the X-axis is a Y-axis, a thickness direction axis of the retardation film substantially perpendicular to the X-axis and the Y-axis is a Z-axis, and refractive indexes of the X-axis, the Y-axis, and the Z-axis respectively correspond to nx, ny, and nz.

22 Claims, 9 Drawing Sheets

(56) References Cited

U.S. PATENT DOCUMENTS

| | | | | |
|---|---|---|---|---|
| 2005/0151896 A1* | 7/2005 | Hara | .................... | G02B 5/3016 |
| | | | | 349/96 |
| 2011/0001906 A1* | 1/2011 | Chang | .................. | G02B 5/3016 |
| | | | | 349/96 |
| 2012/0133871 A1* | 5/2012 | Saigusa | ................ | G02B 5/3083 |
| | | | | 349/108 |
| 2014/0293201 A1* | 10/2014 | Takeda | .................. | B32B 27/302 |
| | | | | 349/118 |
| 2015/0022436 A1* | 1/2015 | Cho | ..................... | G06F 1/1652 |
| | | | | 345/156 |

FOREIGN PATENT DOCUMENTS

| | | |
|---|---|---|
| CN | 101849207 | 9/2010 |
| JP | 2011-170082 | 9/2011 |
| KR | 10-2004-0097373 | 11/2004 |
| KR | 10-2009-0101620 | 9/2009 |
| KR | 10-2013-0000310 | 1/2013 |

* cited by examiner

RETARDATION FILM AND A DISPLAY APPARATUS INCLUDING THE SAME

CROSS-REFERENCE TO RELATED APPLICATIONS

This application claims the benefit of Korean Patent Application No. 10-2016-0064235, filed on May 25, 2016 in the Korean Intellectual Property Office, the disclosure of which is incorporated by reference herein in its entirety.

TECHNICAL FIELD

The described technology relates to a display apparatus, and more particularly, to a retardation film.

DISCUSSION OF RELATED ART

Display apparatuses have been recently developed to be thin and portable. Particularly, the market for flexible display apparatuses, which may be bent or folded according to a user preference or during a manufacturing process, has increased.

In an organic light-emitting display apparatus or a liquid crystal display apparatus, a retardation film may be used with a polarization film to display an image having high contrast over a wide viewing angle.

However, if the retardation film is used in a flat display apparatus, color shifts may occur. Therefore, color coordinates may change with the viewing angle resulting in a decreased image quality.

SUMMARY

Exemplary embodiments of the present invention provide a retardation film. The retardation film includes a stacked structure. The stacked structure includes 2m tilt +C plates and a +A plate. Each of the 2m tilt +C plates includes a liquid crystal layer. The liquid crystal layer includes a material satisfying nx≠ny<nz, in which m is a positive integer, a longitudinal direction axis of the retardation film is an X-axis, a width direction axis of the retardation film substantially perpendicular to the X-axis is a Y-axis, a thickness direction axis of the retardation film substantially perpendicular to the X-axis and the Y-axis is a Z-axis, and refractive indexes of the X-axis, the Y-axis, and the Z-axis respectively correspond to nx, ny, and nz. The +A plate is disposed over the 2m tilt +C plates.

According to an exemplary embodiment of the present invention, the liquid crystal layer may include liquid crystal molecules. The liquid crystal molecules may include a major axis inclined with respect to the Z-axis. Major axes of the liquid crystal molecules of one half of the m tilt +C plates and major axes of the liquid crystal molecules of the other half of m tilt +C plates may be substantially symmetrical to each other with respect to the X-axis.

According to an exemplary embodiment of the present invention, the liquid crystal layer may include a coating layer. The coating layer may have an orientation inclined with respect to the Z-axis.

According to an exemplary embodiment of the present invention, the +A plate may include a horizontal liquid crystal layer. The horizontal liquid crystal layer may have an orientation substantially parallel to the X-axis.

According to an exemplary embodiment of the present invention, the +A plate may include a quarter-wave plate.

According to an exemplary embodiment of the present invention, the +A plate may include reverse wavelength dispersion.

Exemplary embodiments of the present invention provide a retardation film. The retardation film includes at least one tilt +C plate and a +A plate. The at least one tilt +C plate includes a liquid crystal layer. The liquid crystal layer includes C-shaped liquid crystal molecules. The +A plate is arranged over the at least one tilt +C plate.

According to an exemplary embodiment of the present invention, a longitudinal direction axis of the retardation film is an X-axis. The C-shaped liquid crystal molecules may have a shape bending in a direction of the X-axis.

According to an exemplary embodiment of the present invention, a longitudinal direction axis of the retardation film is an X-axis. The C-shaped liquid crystal molecules may have a linearly symmetrically shape with respect to an axis of symmetry defined as a center line of the C-shaped liquid crystal molecules and extending substantially parallel to the X-axis.

According to an exemplary embodiment of the present invention, the at least one tilt +C plate may include a stacked structure. The stacked structure includes 2m +C tilt plates, in which m is a positive integer. A bending direction of the C-shaped liquid crystal molecules of the m plates are opposite to a bending direction of the C-shaped liquid crystal molecules of the remaining m plates.

According to an exemplary embodiment of the present invention, a longitudinal direction axis of the retardation film is an X-axis. The +A plate may include a horizontal liquid crystal layer. The horizontal liquid crystal layer may have an orientation substantially parallel to the X-axis.

According to an exemplary embodiment of the present invention, the +A plate may include a quarter-wave plate.

According to an exemplary embodiment of the present invention, the +A plate may include reverse wavelength dispersion.

Exemplary embodiments of the present invention provide a display apparatus. The display apparatus include a substrate, a display unit, a polarization film, and a retardation film. The display unit is disposed over the substrate. The display unit is bendable or foldable. The display unit includes a plurality of organic light-emitting elements. The polarization film is disposed over the display unit. The retardation film includes a stacked structure. The stacked structure includes 2m tilt +C plates and a +A plate. Each of the 2m tilt +C plates includes a liquid crystal layer. The liquid crystal layer includes a material satisfying nx≠ny<nz, in which m is a positive integer, a longitudinal direction axis of the retardation film is an X-axis, a width direction axis of the retardation film substantially perpendicular to the X-axis is a Y-axis, a thickness direction axis of the retardation film substantially perpendicular to the X-axis and the Y-axis is a Z-axis, and refractive indexes of the X-axis, the Y-axis, and the Z-axis respectively correspond to nx, ny, and nz. The +A plate is disposed over the 2m tilt +C plates. The retardation film is between the display unit and the polarization film.

According to an exemplary embodiment of the present invention, when the display unit is in a bent or a folded state, the display unit may have a convex shape in a light-emitting direction of the organic light-emitting elements.

According to an exemplary embodiment of the present invention, when a portion of the display unit is in a bent or folded state, a curvature center of the bent or folded portion of the display unit may be closer to the display unit than the polarization film.

According to an exemplary embodiment of the present invention, the 2m tilt +C plates may be disposed over the display unit and m may be a positive integer.

Exemplary embodiments of the present invention provide a display apparatus. The display apparatus includes a substrate, a display unit, a polarization film, and a retardation film. The display unit is disposed over the substrate. The display unit is bendable or foldable. The display unit includes a plurality of organic light-emitting elements. The polarization film is disposed over the display unit. The retardation film includes at least one tilt +C plate and a +A plate. The at least one tilt +C plate includes a liquid crystal layer. The liquid crystal layer includes C-shaped liquid crystal molecules. The +A plate is arranged over the at least one tilt +C plate.

According to an exemplary embodiment of the present invention, the at least one tilt +C plate may be disposed over the display unit.

According to an exemplary embodiment of the present invention, the display unit may be in a bent or folded state. The display unit may have a convex shape in a light-emitting direction of the organic light-emitting elements.

According to an exemplary embodiment of the present invention, a curvature center of a portion of the display unit may be bent or folded. The curvature center may be closer to the display unit than the polarization film.

According to an exemplary embodiment of the present invention, the retardation film may be disposed between the display unit and the polarization film.

BRIEF DESCRIPTION OF THE DRAWINGS

These and/or other aspects will become apparent and more readily appreciated from the following description of the exemplary embodiments of the present invention, taken in conjunction with the accompanying drawings, in which.

DETAILED DESCRIPTION OF THE EMBODIMENTS

Figure 1:
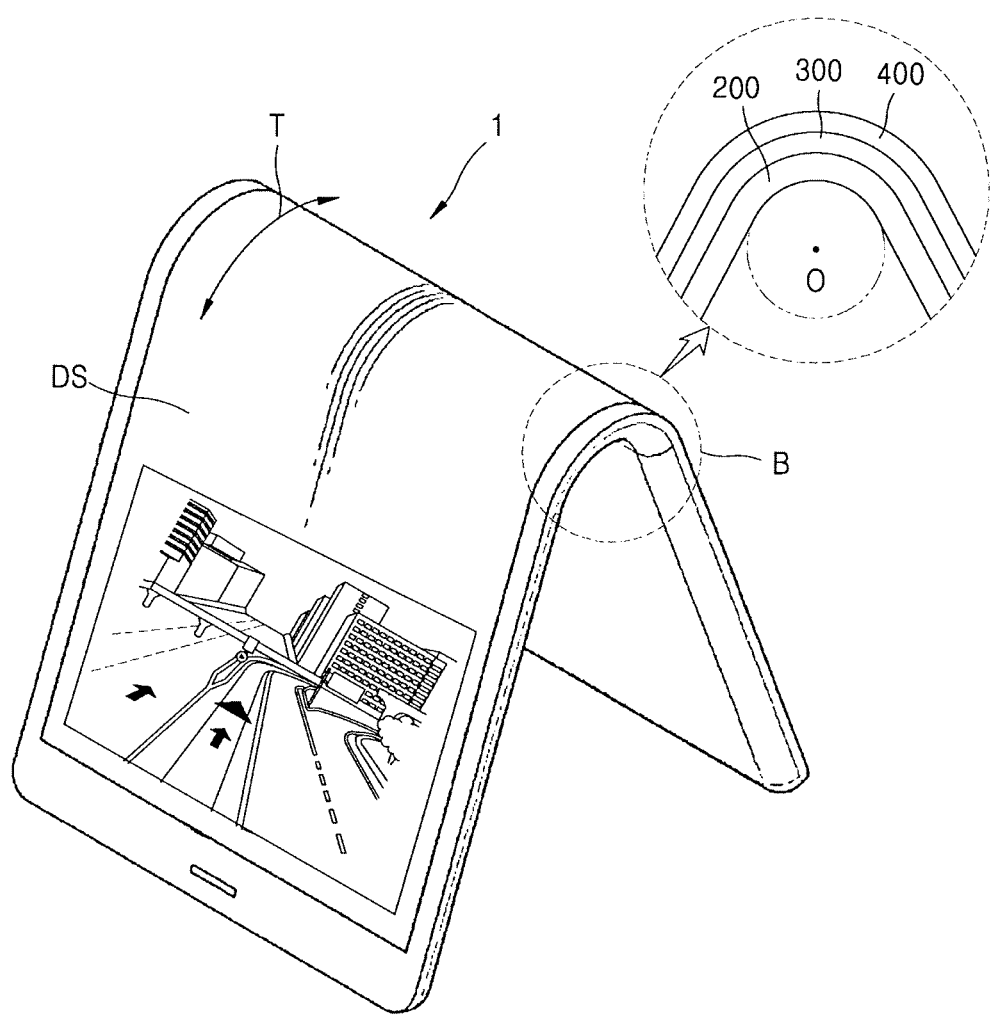
FIG. 1 is a perspective view illustrating an electronic apparatus including a flexible display apparatus according to an exemplary embodiment of the present invention.

Exemplary embodiments of the present invention may include different forms and embodiments and should not be construed as being limited to the descriptions set forth herein. Accordingly, the exemplary embodiments of the present invention are described below, by referring to the figures, to explain aspects of the present inventive concept.

It will be understood that when a layer, region or component is referred to as being "formed on" or "disposed on" another layer, region, or component, it can be directly or indirectly formed or disposed on the other layer, region or component. Therefore, intervening layers, regions, or components may be present.

Reference will now be made in detail to exemplary embodiments of the present invention, examples of which are illustrated in the accompanying drawings, wherein like reference numerals may refer to like elements throughout. Sizes of elements in the drawings may be exaggerated for convenience of explanation and the following exemplary embodiments of the present invention are not limited to the arrangements shown.

FIG. 1 is a perspective view illustrating an electronic apparatus 1 including a flexible display apparatus according to an exemplary embodiment of the present invention.

Referring to FIG. 1, the electronic apparatus 1 may be a portable phone, a tablet personal computer (PC), or a wearable device, each of which may include a bendable or foldable portion. The electronic apparatus 1 may include a display surface DS. The display surface DS may display an image to a user. The display surface DS may further allow the user to perform an informational search, view photographs, watch moving images, etc.

The electronic apparatus 1 may include a flexible display apparatus. According to an exemplary embodiment of the present invention, the flexible display apparatus may include a display unit 200, an encapsulating unit 300, and an optical film unit 400. The encapsulating unit 300 may be arranged over the display unit 200. The optical film unit 400 may be arranged over the encapsulating unit 300. The optical film unit 400, the encapsulating unit 300, and the display unit 200 may be arranged to be close to the display surface DS, respectively. For example, the optical film unit 400 may be arranged closer to the display surface DS than the encapsulating unit 300 and the display unit 200. The encapsulating unit 300 may be arranged closer to the display surface DS than the display unit 200. The display unit 200 may include a display element. The display element may emit light to display an image on the display surface DS.

The electronic apparatus 1 may be bent or folded in a direction T in which the display surface DS is convex. The electronic apparatus 1 may include a bending area B. The bending area B may be a bendable or foldable area of the electronic apparatus 1. According to an exemplary embodiment of the present invention, the bending area B may include a curvature center O. The curvature center O may be the center of a circle of curvature of at least a portion of a curve of the display unit 200. The curvature center O may be closer to the display unit 200 than the optical film unit 400.

Accordingly, a tensile stress may be applied to the display surface DS of the electronic apparatus 1. Additionally, a compressive stress may be applied to a surface opposite the display surface DS of the electronic apparatus 1.

Figure 2:
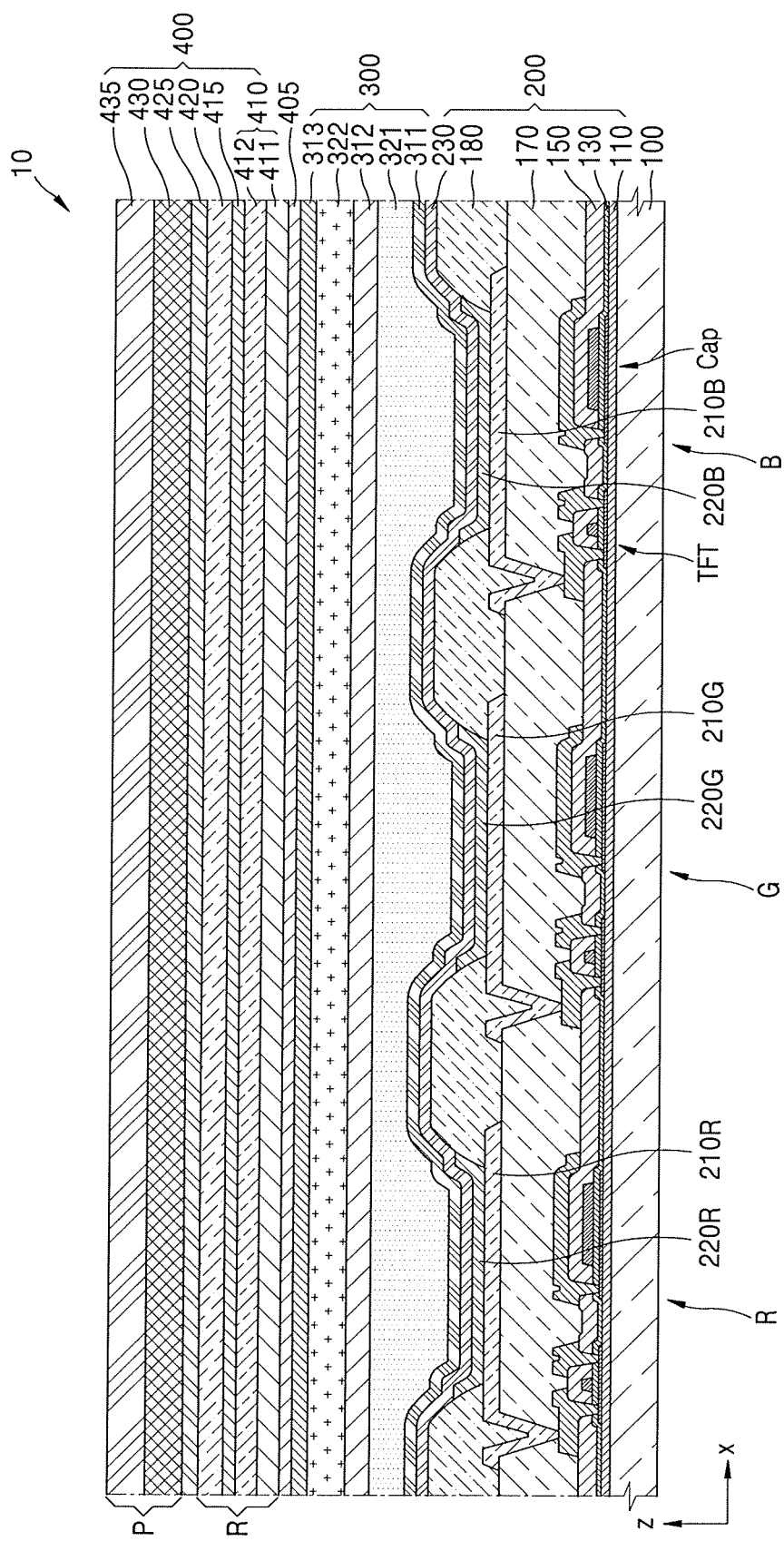
FIG. 2 is a cross-sectional view illustrating a flexible display apparatus according to an exemplary embodiment of the present invention.
Figure 3:
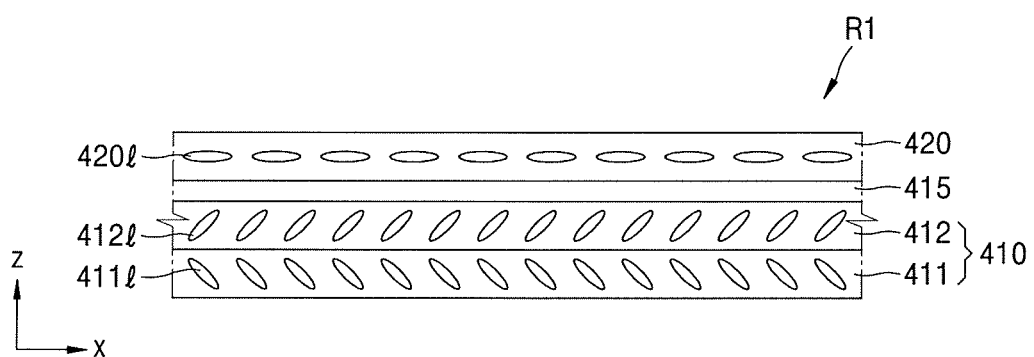
FIG. 3 is a cross-sectional view illustrating a retardation film according to an exemplary embodiment of the present invention.
Figure 4:
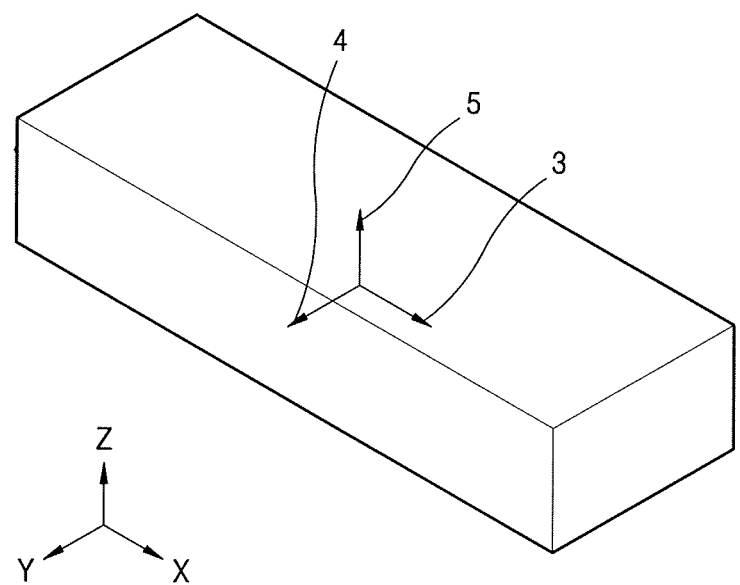
FIG. 4 illustrates a refractive index of a retardation film according to an exemplary embodiment of the present invention.

FIG. 2 is a cross-sectional view illustrating a flexible display apparatus 10 according to an exemplary embodiment of the present invention. FIG. 3 is a cross-sectional view illustrating a retardation film according to an exemplary embodiment of the present invention. FIG. 4 illustrates a refractive index of a retardation film according to an exemplary embodiment of the present invention.

Referring to FIG. 2, the flexible display apparatus 10 may be an organic light-emitting display apparatus. The organic light-emitting display apparatus may include a display element. The display element may be an organic light-emitting diode (OLED). However, exemplary embodiments of the present invention are not limited thereto. Accordingly, the flexible display apparatus 10 may include a display element different than that of an OLED. Hereinafter, the flexible display apparatus 10 as described is the organic-light emitting display apparatus including an OLED as a display element.

According to an exemplary embodiment of the present invention, the flexible display apparatus 10 may include a substrate 100, a display unit 200, an encapsulating unit 300, and an optical film unit 400.

As illustrated in FIG. 2, the flexible display apparatus 10 may include a back plane. The back plane may be the display unit 200 arranged over the substrate 100. The back plane may include the substrate 100, a plurality of first electrodes 210R, 210G, and 210B, and a pixel defining film 180. The pixel defining film 180 may expose at least a portion of each of the plurality of first electrodes 210R, 210G, and 210B. The portion of the plurality of first electrodes 210R, 210G, and 210B exposed by the pixel defining film 180 may include a center portion. The pixel defining film 180 may have a shape protruding from the respective first electrodes 210R, 210G, and 210B with respect to a center of the substrate 100 in a Z-direction.

The substrate 100 may include at least one of various materials, for example, glass, a metal, and/or a plastic, such as polyethylene terephthalate (PET), polyethylene naphthalate (PEN), or polyimide (PI); however, exemplary embodiments of the present invention are not limited thereto.

The plurality of first electrodes 210R, 210G, and 210B may be pixel electrodes. The first electrode 210R may be referred to as a first pixel electrode, the first electrode 210G may be referred as a second pixel electrode, and the first electrode 210B may be referred to as a third pixel electrode. Intermediate layers may be arranged on the first pixel electrode 210R, the second pixel electrode 210G, and the third pixel electrode 210B, The intermediate layers may be different from each other. The plurality of first electrodes 210R, 210G, and 210B including the first pixel electrode 210R, the second pixel electrode 210B, and the third pixel electrode 210G may be hereinafter referred to as a pixel electrode 210R, a pixel electrode 210G, and a pixel electrode 210B.

Each of the pixel electrodes 210R, 210G, and 210B may be a transparent electrode or a semitransparent electrode. Alternatively, each of the pixel electrodes 210R, 210G, and 210B may be a reflective electrode. When each of the pixel electrodes 210R, 210G, and 210B is a transparent electrode or a semitransparent electrode, the pixel electrodes 210R, 210G, and 210B may include indium tin oxide (ITO), indium zinc oxide (IZO), zinc oxide (ZnO), indium oxide (In$_2$O$_3$), indium gallium oxide (IGO), or aluminum zinc oxide (AZO). When each of the pixel electrodes 210R, 210G, and 210B is a reflective electrode, the pixel electrodes 210R, 210G, and 210B may include a reflective film. The reflective film may include silver (Ag), magnesium (Mg), aluminum (Al), platinum (Pt), palladium (Pd), gold (Au), nickel (Ni), neodymium (Nd), iridium (Ir), chromium (Cr), or a compound thereof. The pixel electrodes 210R, 210G, and 210B may also include a film. The film may include indium tin oxide (ITO), indium zinc oxide (IZO), zinc oxide (ZnO), or indium oxide (In$_2$O$_3$). However, exemplary embodiments of the present invention are not limited thereto. A structure and material composition of the pixel electrodes 210R, 210G, and 210B may be variously modified.

The pixel electrodes 210R, 210G, and 210B may be disposed in a display area of the substrate 100.

The pixel defining film 180 may include an opening. The opening may expose substantially an entire portion or a portion of a center region of the corresponding pixel electrode 210R, 210G, or 210B to the outside. Accordingly, a pixel may be defined. The pixel defining film 180 may prevent generation of an arc from an end of the corresponding pixel electrodes 210R, 210G, or 210B by increasing a distance between the end of the corresponding pixel electrode 210R, 210G, or 210B and an opposite electrode. The opposite electrode may be arranged opposite the corresponding pixel electrode 210R, 210G, or 210B.

Referring to FIG. 2, the back plane may further include various structural elements. According to an exemplary embodiment of the present invention, a thin film transistor TFT may be arranged over the substrate 100. A capacitor Cap may also be arranged over the substrate 100. The back plane may further include a buffer layer 110, a gate insulation film 130, an interlayer insulation layer 150, and a planarization film 170. The buffer layer 100 may prevent permeation of impurities into a semiconductor layer of the thin film transistor TFT. The gate insulation film 130 may insulate a gate electrode from the semiconductor layer of the thin film transistor TFT. The interlayer insulation layer 150 may insulate the gate electrode from source/drain electrodes of the thin film transistor TFT. The planarization film 170 may include a substantially flat upper surface. The planarization film 170 may cover the thin film transistor TFT.

After the back plane is formed, intermediate layers 220R, 220G, and 220B may be arranged over the corresponding pixel electrodes 210R, 210G, and 210B as illustrated in FIG. 2. Each of the intermediate layers 220R, 220G, and 220B may include a multilayer structure. The multilayer structure may include a light-emitting layer. Each of the intermediate layers 220R, 220G, and 220B may be a common layer. The common layer may correspond to substantially the entire substrate 100. Alternatively, each of the intermediate layers 220R, 220G, and 220B may be a patterned layer. The patterned layer may correspond to the respective pixel electrodes 210R, 210G, and 210B. Each of the intermediate layers 220R, 220G, and 220B may include a low molecule material or a polymer. Each of the intermediate layers 220R, 220G, and 220B may also include a hole injection layer, a hole transport layer, a light-emitting layer, an electron transport layer, and/or an electron injection layer. The intermediate layers 220R, 220G, and 220B may be formed according to various methods, such as a deposition method, a spin-coating method, an ink-jet printing method, and/or a laser thermal transfer method.

An opposite electrode 230 may be arranged over the intermediate layers 220R, 220G, and 220B. The opposite electrode 230 may be a transparent electrode or a semitransparent electrode. Alternatively, the opposite electrode 230 may be a reflective electrode. When the opposite electrode 230 is a transparent electrode or a semitransparent electrode, the opposite electrode 230 may include a layer including a metal. The metal may have a low work function. Accordingly, the layer of the opposite electrode 230 may include a metal such as lithium (Li), calcium (Ca), lithium fluoride (LiF/Ca), LiF/Al, aluminum (Al), silver (Ag), magnesium (Mg), or a compound thereof. The opposite electrode 230 may further include a transparent layer or a semitransparent layer. The transparent layer or the semitransparent layer of the opposite electrode 230 may include indium tin oxide (ITO), indium zinc oxide (IZO), zinc oxide (ZnO), or indium oxide ($In_2O_3$). When the opposite electrode 230 is a reflective electrode, the opposite electrode 230 may include lithium (Li), calcium (Ca), lithium fluoride/calcium (LiF/Ca), lithium fluoride/aluminum (LiF/Al), aluminum (Al), silver (Ag), magnesium (Mg) or a compound thereof. However, exemplary embodiments of the present invention are not limited thereto. Accordingly, a structure and material composition of the opposite electrode 230 may be variously modified.

The encapsulating unit 300 may be disposed over the display unit 200. The encapsulating unit 300 may prevent permeation of external oxygen or moisture into display elements including the pixel electrodes 210R, 210G, and 210B, the intermediate layers 220R, 220G, and 220B, and the opposite electrode 230.

The encapsulating unit 300 may include at least one inorganic film. The encapsulating unit 200 may further include at least one organic film. The encapsulating unit 300 may include a stacked structure. The stacked structure may include the at least one inorganic film and the at least one organic film alternately and repeatedly stacked. According to an exemplary embodiment of the present invention, the encapsulating unit 300 may include a first inorganic film 311, a second inorganic film 312, and a third inorganic film 313. The second inorganic film 312 may be disposed over the first inorganic film 311. The third inorganic film 313 may be disposed over the second inorganic film 312 and the first inorganic film 311. The encapsulating unit 300 may further include a first organic film 321 and a second organic film 322. The first organic film 321 may be disposed between the first inorganic film 311 and the second inorganic film 312. The second organic film 322 may be disposed between the second inorganic film 312 and the third inorganic film 313. However, the encapsulating unit 300 according to exemplary embodiments of the present invention is not limited thereto. Thus, the number of inorganic films and organic films may be variously modified. Additionally, a stacking order of the inorganic films and the organic films may be modified according to a manufacturing design.

The first organic film 321 and the second organic film 322 of the encapsulating unit 300 may include a material with a high/low molecular weight. The first organic film 321 and the second organic film 322 of the encapsulating unit 300 may be a single film or a multilayer film and may include polyethylene terephthalate (PET), polyimide (PI), polycarbonate (PC), epoxy, polyethylene (PE), or polyacrylate. Each of the first inorganic film 311, the second inorganic film 312, and the third inorganic film 313 of the encapsulating unit 300 may be a single film or a multilayer film and may include a metal oxide or a metal nitride.

The encapsulating unit 300 may include a structure in which thin film-shape insulating layers including an inorganic film and/or an organic film are stacked. Accordingly, the encapsulating unit 300 may have a flexible property.

Therefore, breaking of the encapsulating unit 300 may be reduced when the encapsulating unit 300 is bent or folded.

The optical film unit 400 may be disposed over the encapsulating unit 300. The optical film unit 400 may include a retardation film R. The retardation film R may include a tilt positive C (+C) plate layer 410. The retardation film R may further include a positive A (+A) plate layer 420. The optical film unit 400 may also include a polarization film P. The polarization film P may include a polarization layer 430. The polarization film P may also include a support layer 435. The support layer 435 may be disposed over the polarization layer 430. Although it is illustrated in FIG. 2 that the tilt +C plate layer 410 of the retardation film R includes two layers, specifically a first tilt +C plate 411 and a second tilt +C plate 412, the tilt +C plate layer 410 of the retardation film R may include a single layer or more than three layers which are different from the two layers, namely, the first tilt +C plate 411 and the second tilt +C plate 412.

A first adhesive layer 405 may be disposed between the encapsulating unit 300 and the optical film unit 400. The first adhesive layer 405 may include a material having an adhesive force. Therefore, the first adhesive layer 405 may attach the optical film unit 400 to the encapsulating unit 300. The first adhesive layer 405 may also be configured to and function as a cushion to prevent transmission of external shock to the encapsulating unit 300. For example, the first adhesive layer 405 may include a pressure sensitive adhesive (PSA).

The tilt +C plate layer 410 may be disposed over the first adhesive layer 405. The tilt +C plate layer 410 may include a stacked structure. The stacked structure may include about 2m of tilt +C plate layers in which m is a positive integer. A curvature index of a retardation film may be defined as follows.

Referring to FIG. 4, an X-axis is a longitudinal direction axis of a retardation film. A Y-axis is a widthwise direction axis of the retardation film. A Z-axis is a thickness direction axis of the retardation film. The X-axis, the Y-axis, and the Z-axis may be substantially perpendicular to each other. When a refractive index of the X-axis is nx 3, a refractive index of the Y axis is ny 4, and a refractive index of the Z axis is nz 5, a refractive index of a tilt +C plate may be represented by the following Relationship 1.

$$nx \neq ny < nz \qquad \text{Relationship 1}$$

Although a tilt +C plate may be similar to a +C plate when a refractive index in a thickness direction, i.e., the Z-axis, is greatest in the tilt +C plate and the +C plate, a relationship of refractive indexes of the tilt +C plate is different from a relationship of refractive indexes of the +C plate. Refractive indexes of the +C plate may be represented by nx=ny<nz. Moreover, if the relationship of the refractive indexes is nx≈ny<nz, the refractive indexes nx and ny of the tilt +C plate may be different from the refractive indexes of the +C plate. Accordingly, a retardation film satisfying Relationship 1 herein is referred to as a tilt +C plate in order to differentiate from a related +C plate.

A thickness retardation value Rth and an in-plane retardation value Rin of the tilt +C plate may be represented by the following Relationships 2 and 3.

$$Rth = d \times (nz - ny) \qquad \text{Relationship 2}$$

$$Rin = d \times (nx - ny) \qquad \text{Relationship 3}$$

Referring to Relationships 2 and 3, d is a thickness of a film.

Since the +C plate is a film in which the in-plane retardation value Rin is almost 0 and the thickness retardation value Rth is a positive value, the tilt +C plate may be a film in which the in-plane retardation value Rin is not 0 and the thickness retardation value Rth is a positive value. Accordingly, the +C plate and the tilt +C plate may be distinguished from each other by whether the in-plane retardation value Rin approximates to 0.

In a uniaxial retardation film, among the refractive indexes nx, ny, and nz in axis directions, two of the refractive indexes are substantially the same. The remaining one of the refractive indexes is different from other refractive indexes. In a biaxial retardation film, three of the refractive indexes nx, ny, and nz in the respective axis directions are different from each other. Accordingly, the related +C plate may correspond to the uniaxial retardation film and the tilt +C plate may correspond to the biaxial retardation film.

Accordingly, the tilt +C plate may be defined as the biaxial retardation film in which the in-plane retardation value Rin is not 0 and the thickness retardation value Rth is a positive value.

Referring to FIG. 3, the retardation film R1 may include the tilt +C plate layer 410. The tilt +C plate layer 410 may include a tilt +C plate. The tilt +C plate may include a liquid crystal layer. The liquid crystal layer may include liquid crystal molecules. The liquid crystal molecules may have a major axis inclined by an angle with respect to the X-axis. Accordingly, the tilt +C plate may include a material in which nx is different from ny and which satisfies the Relationship 1 of nx≠ny<nz, differently from the +C plate.

Among 2m with m as a positive integer of tilt +C plates, major axes of liquid crystal molecules of m of the tilt +C plates and major axes of liquid crystal molecules of the remaining m of the tilt +C plates are substantially symmetrical to each other with respect to the X-axis. A structure of the liquid crystal molecules included in the tilt +C plates will be described with reference to FIG. 5A.

The +A plate layer 420 may be disposed over the tilt +C plate layer 410. A second adhesive layer 415 may be disposed between the tilt +C plate layer 410 and the +A plate layer 420. The second adhesive layer 415 may attach the +A plate layer 420 to the tilt +C plate layer 410. The second adhesive layer 415 may include a material similar to or substantially the same as a material of the first adhesive layer 405 illustrated in FIG. 1. For example, the second adhesive layer 415 may include a pressure sensitive adhesive (PSA).

The +A plate layer 420 may include a +A plate. Similar to the tilt +C plate, the +A plate may be defined by using refractive indexes of three axis directions of a retardation film. As illustrated in FIG. 4, when a refractive index of an X-axis direction, i.e., a longitudinal direction of the retardation film, is nx 3, a refractive index of a Y-axis direction, i.e., a widthwise direction of the retardation film, is ny 4, and a refractive index of a Z-axis direction, i.e., a thickness direction of the retardation film, is nz 5, a relationship of refractive indexes of the +A plate may be represented by the following Relationship 4.

$$nx > ny = nz \qquad \text{Relationship 4}$$

In the +A plate, the refractive index of the longitudinal direction, i.e., the X-axis direction, may be greater than the refractive index of the widthwise direction, i.e., the Y-axis direction, and the thickness direction, i.e., the Z-axis direction. The refractive index of the widthwise direction, i.e., the Y-axis direction, may be substantially the same as the refractive index of the thickness direction, i.e., the Z-axis direction. Therefore, the +A plate may correspond to a uniaxial retardation film. A thickness retardation value Rth and an in-plane retardation value Rin of the +A plate may be represented by Relationship 2, Rtd=d×(nz−ny), and Relationship 3, Rin=d×(nx−ny). Accordingly, the +A plate may be a film in which the thickness retardation value Rth is around zero 0 and the in-plane retardation value Rin is a positive value.

As illustrated in FIG. 3, the +A plate layer 420 may include the +A plate having a liquid crystal layer. The liquid crystal layer may include a material which is horizontally oriented to be substantially parallel to the X-axis. The material included in the liquid crystal layer may also satisfy the relationship of nx>ny=nz.

To form the +A plate as a shape of the liquid crystal layer, a coating method may be used. The coating method may coat the liquid crystal layer over a lower layer of the +A plate. The coating method may then horizontally orient the liquid crystal layer to be substantially parallel to the X-axis. After manufacturing the liquid crystal layer as a film which is horizontally oriented to be substantially parallel to the X-axis in a way similar to or substantially the same as the coating method, a stacking method may be used. The stacking method may stack the film over the lower layer of the +A plate. Since the stacking method increases a thickness of the retardation film, the coating method may more readily form a thin +A plate and a flexible retardation film R, R1. However, the +A plate is not limited to the above-described liquid crystal layer. The +A plate may include a non-liquid crystal polymer, such as a uniaxial stretched polycarbonate (PC) or a uniaxial stretched cyclo olefin (COP).

According to an exemplary embodiment of the present invention, the +A plate of the +A plate layer 420 may be a quarter-wave plate, i.e., a λ/4 plate. The quarter-wave plate may generate a phase difference of a quarter wavelength to incident light. By using the +A plate of the quarter-wave plate, incident linearly polarized light may be converted into circularly polarized light. Moreover, the +A plate may have a characteristic of reverse wavelength dispersion. Accordingly, when a wavelength of light is shortened, the +A plate may have a wavelength dispersion characteristic of a small phase difference. Furthermore, the circularly polarized light realized by the +A plate may be increased. The above-described characteristic of the +A plate layer 420 is substantially the same in the present exemplary embodiment of the present invention and in other exemplary embodiments of the present invention described herein.

Referring to FIG. 2, the polarization film P may be disposed over the +A plate layer 420. A third adhesive layer 425 may be disposed between the retardation film R and the polarization film P. The third adhesive layer 425 may attach the polarization film P to the retardation film R. The third adhesive layer 425 may include a material substantially the same as or similar to a material of the first adhesive layer 405 and the second adhesive layer 415. For example, the third adhesive layer 425 may include a pressure sensitive adhesive (PSA).

A polarization layer 430 may be disposed over the third adhesive layer 425. The polarization layer 430 may include a polarizer. The polarizer may be a functional element and may extract light vibrating in a certain direction from incident light vibrating in various directions. For example, the polarizer may be a polyvinyl alcohol-based linear polarizer. The polyvinyl alcohol-based linear polarizer may be formed by stretching in an axis direction a polyvinyl alcohol (PVA)-based film in which a dichroic dye or iodine is absorbed and oriented.

A supporting layer 435 may be disposed over the polarization layer 430. The supporting layer 435 may protect the polarization film 430. The supporting layer 435 may also support the polarization film 430. The supporting layer 435 may include a resin film, such as a tri-acetyl cellulose (TAC) film. The supporting layer 435 may further include a polyethylene terephthalate (PET) film and an acryl film. Although FIG. 2 illustrates that the supporting layer 435 is disposed over the polarization layer 430, an additional supporting layer may be disposed between the third adhesive layer 425 and the polarization layer 430.

External light may be reflected from a metal electrode layer, such as the opposite electrode, thereby decreasing a quality of an image. Since the retardation film R of the quarter-wave plate having the reverse wavelength dispersion characteristic is disposed below the polarization film P, external light might not be reflected and therefore might not decrease a quality of an image. Therefore, since the external light may be linearly polarized by transmitting the quarter-wave plate and the linearly polarized light may be converted into the circularly polarized light by transmitting the retardation film R, the external light might not be reflected and might not exit outside the display apparatus 10. This may occur although the external light is incident into an inside of the flexible display apparatus 10. Therefore, visibility of the flexible display apparatus 10 may be increased. A structure of the retardation film R according to an exemplary embodiment of the present invention as illustrated in FIG. 3 will be described in more detail with reference to FIGS. 5A and 5B.

Figure 5A:
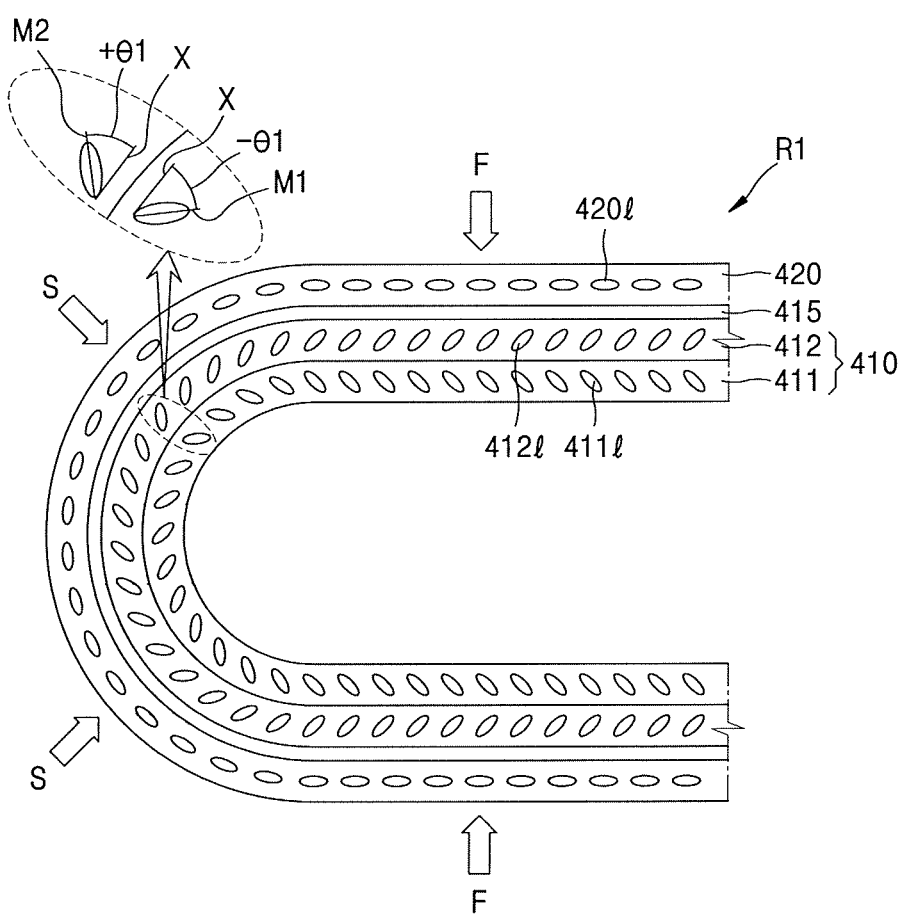
FIG. 5A is a cross-sectional view illustrating a folded or a bent state of a retardation film of FIG. 3 according to an exemplary embodiment of the present invention.
Figure 5B:
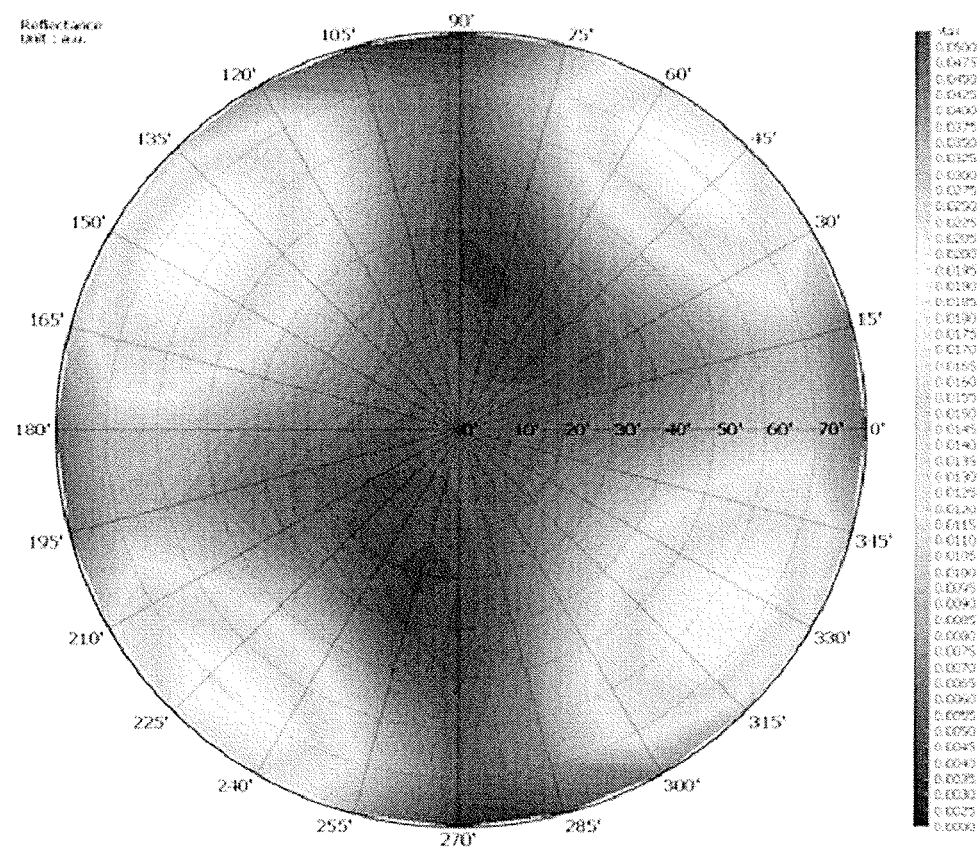
FIG. 5B is a graph illustrating brightness variations according to viewing angles in a display apparatus including a retardation film of FIG. 3 according to an exemplary embodiment of the present invention.

FIG. 5A is a cross-sectional view illustrating a bent or folded state of a retardation film R1 of FIG. 3 according to an exemplary embodiment of the present invention. FIG. 5B is a graph illustrating brightness variations according to viewing angles in a display apparatus including a retardation film R1 of FIG. 3 according to an exemplary embodiment of the present invention. An X-axis is referred to as a longitudinal direction axis of a retardation film, a Y-axis is referred to as a widthwise direction axis of the retardation film, and a Z-axis is referred to as a thickness direction axis of the retardation film Referring to FIG. 5A, a retardation film R1 may include a tilt +C plate layer 410. The retardation film R1 may further include a +A plate layer 420. The +A plate layer 420 may be disposed over the tilt +C plate layer 410. A second adhesive layer 415 may be disposed between the tilt +C plate layer 410 and the +A plate layer 420. The tilt +C plate layer 410 may include the first tilt +C plate 411. The tilt +C plate layer 410 may further include the second tilt +C plate 412. The second tilt +C plate 412 may be disposed over the first tilt +C plate 411. Accordingly, when the number of stacking tilt +C plates is 2m with m as a positive integer, m may be around one. The +A plate layer 420 may include a +A plate. The +A plate may include a horizontal liquid crystal layer. The horizontal liquid crystal layer may be horizontally oriented. The horizontal liquid crystal layer may include horizontal liquid crystal molecules 420*l*. The horizontal liquid crystal molecules 420*l* may include a major axis substantially parallel to the X-axis.

The first tilt +C plate 411 may include first liquid crystal molecules 411*l*. The first liquid crystal molecules 411*l* may include a major axis M1 which is inclined by an angle in a counterclockwise direction with respect to the Z-axis. Alternatively, the first liquid crystal molecules 411*l* may include a major axis M1 which is inclined by an angle in a clockwise direction with respect to the Z-axis. The second tilt +C plate 412 may include second liquid crystal molecules 412*l*. The second liquid crystal molecules 412*l* may include a major axis M2 which is inclined by an angle in a clockwise direction with respect to the Z-axis. Alternatively, the second liquid crystal molecules 412*l* may include a major axis M2 which is inclined by an angle in a counterclockwise direction with respect to the Z-axis. Therefore, an inclined direction, for example, a counterclockwise direction, of the first tilt +C plate 411 with respect to the Z-axis may be opposite to an inclined direction, for example, a clockwise direction, of the second tilt +C plate 412 with respect to the Z-axis. The major axis M1 of the first liquid crystal molecules 411*l* of the first tilt +C plate 411 and the major axis M2 of the second liquid crystal molecules 412*l* of the second tilt +C plate 412 may be substantially symmetrical to each other with respect to the X-axis. Accordingly, an overlapping orientation state of the first liquid crystal molecules 411*l* and the second liquid crystal molecules 412*l* may be substantially similar to an orientation state of the related +C plate which may be vertically oriented. Accordingly, the +C plate may be referred to as a vertical liquid crystal layer. The vertical liquid crystal layer may include liquid crystal molecules having a major axis substantially parallel to the Z-axis. Therefore, the tilt +C plate layer 410 including two of inclined liquid crystal layers may function as the uniaxial retardation film, i.e., the +C plate.

When the flexible display apparatus including the above-described retardation film R1 is bent or folded, tensile stress or compressive stress may be generated in a bending or folding portion of the retardation film R1. When the tensile stress or the compressive stress is generated, an orientation state of the horizontal liquid crystal molecules 420*l* of the +A plate layer 420 might not be changed. However, an orientation state of the first liquid crystal molecules 411*l* and an orientation state of the second liquid crystal molecules 412*l* of the tilt +C plate layer 410 may be changed. Therefore, the orientation states of the first liquid crystal molecules 411*l* and the second liquid crystal molecules 412*l* when the bending or folding portion of the retardation film R1 is viewed from a side direction S may be different than the orientation states of the first liquid crystal molecules 411*l* and the second liquid crystal molecules 412*l* when a flat portion of the retardation film R1 is viewed from a frontal direction F.

Referring to FIG. 5A, the retardation film R1 may include an angle $-\theta 1$ and an angle $+\theta 1$ when viewed from the side direction S. The angle $-\theta 1$ may be defined between the X-axis and the major axis M1 of the first liquid crystal molecules 411*l*. The angle $+\theta 1$ may be defined between the X-axis and the major axis M2 of the second liquid crystal molecules 412*l*. When the retardation film R1 is viewed from the side direction S, the angle $-\theta 1$ may be compensated by the angle $+\theta 1$. Therefore, the major axis M1 of the first liquid crystal molecules 411*l* and the major axis M2 of the second liquid crystal molecules 412*l* may be substantially symmetrical to each other with respect to X-axis. Herein, a negative symbol (−) is referred to as an angle inclined toward a downward (−Z) direction. A positive symbol (+) is referred to as an angle inclined toward an upward (+Z) direction. As such, the overlapping orientation state of the first liquid crystal molecules 411*l* and the second liquid crystal molecules 412*l* may be substantially similar to the orientation state of the related +C plate which is vertically oriented, as if the retardation film R1 is seen from the frontal direction F. Accordingly, when the flexible display apparatus is bent or folded, the overlapping orientation state of the first liquid crystal molecules 411*l* and the second liquid crystal molecules 412*l* viewed from the frontal direction F and the overlapping orientation state of the first liquid crystal molecules 411*l* and the second liquid crystal molecules 412*l* viewed from the side direction S, may be substantially the same as or similar to each other. Therefore, a color shift, which may be caused by variation of the viewing angles, may be reduced.

FIG. 5B illustrates brightness variations according to viewing angles in a display apparatus according to an exemplary embodiment of the present invention. Referring to FIG. 5B, a horizontal axis represents a range of viewing angles from about 0 degree to about 80 degrees. Color distribution illustrated on the left side of the horizontal axis may represent a decrease of brightness of the flexible display apparatus from a blue color to a red color. In a display apparatus including the retardation film R1 as illustrated in FIGS. 3 and 5A, brightness may be decreased according to an increase of the viewing angle. Therefore, a brightness value may become a lowest brightness value at about 70 degrees of the viewing angle. Moreover, a low brightness region may be narrowly formed in substantially an entire measured region of the display apparatus. The low brightness region may be illustrated with angles on a circular circumferential line. Accordingly, color shifting according to variation of viewing angles may be decreased by including the retardation film R1 according to an exemplary embodiment of the present invention in the flexible display apparatus.

Figure 6A:
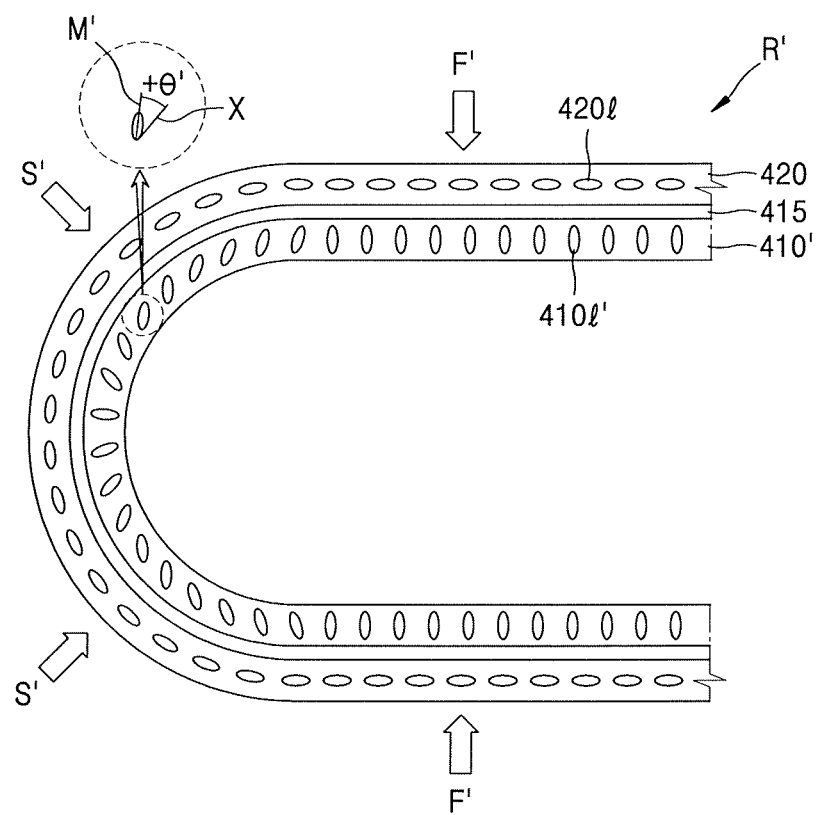
FIG. 6A is a cross-sectional view illustrating a folded or a bent state of a retardation film as a comparative example.
Figure 6B:
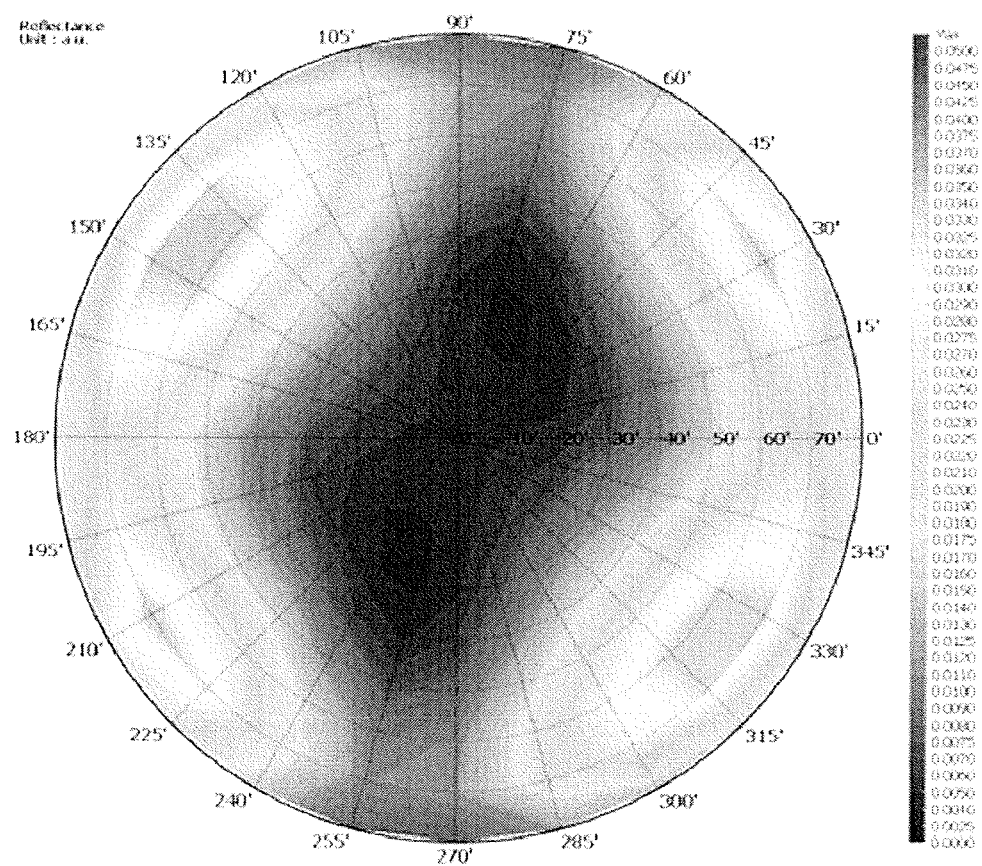
FIG. 6B is a graph illustrating brightness variations according to viewing angles in a display apparatus including a retardation film of FIG. 6A according to a comparative example.

FIG. 6A is a cross-sectional view illustrating a folded or bent state of a retardation film R' as a comparative example. FIG. 6B is a graph illustrating brightness variations according to viewing angles in a display apparatus including the retardation film R' of FIG. 6A as a comparative example. The X-axis represents a longitudinal direction axis of the retardation film R', the Y-axis represents a width direction axis of the retardation film R', and the Z-axis represents a thickness direction of the retardation film R'.

Referring to FIG. 6A, the retardation film R' may include a +C plate layer 410'. The retardation film R' may further include a +A plate layer 420. The +A plate layer 420 may be disposed on the +C plate layer 410'. A second adhesive layer 415 may be disposed between the +C plate layer 410' and the +A plate layer 420. The +C plate layer 410' may include a +C plate. The +C plate may include a vertical liquid crystal layer. The vertical liquid crystal layer may be vertically oriented. The vertical liquid crystal layer may include vertical liquid crystal molecules 410*l'*. The vertical liquid crystal molecules 410*l'* may include a major axis which is substantially parallel to the Z-axis. The +A plate layer 420 may include a +A plate. The +A plate may include a horizontal liquid crystal layer. The horizontal liquid crystal layer may be horizontally oriented. The horizontal liquid crystal layer may include horizontal liquid crystal molecules 420*l*. The horizontal liquid crystal molecules 420*l* may include a major axis which is substantially parallel to the X-axis. Accordingly, the +C plate and the +A plate may include characteristics of a uniaxial retardation film.

When the flexible display apparatus including the retardation film R' is bent or folded, a tensile stress and a compressive stress may be applied to a bending or folding portion of the retardation film R'. Due to the tensile stress and the compressive stress, an orientation state of the horizontal liquid crystal molecules 420*l* of the +A plate layer 420 might not be changed. However, an orientation state of the vertical liquid crystal molecules 410*l'* of the +C plate layer 410 may be changed. Therefore, the orientation state of the vertical liquid crystal molecules 410*l'* when the bending or folding portion of the retardation film R' is viewed from a side direction S' may be different than the orientation state of the horizontal liquid crystal molecules 410*l'* when the bent or folded portion of the retardation film R' is viewed from a frontal direction F'.

The vertical liquid crystal molecules 410*l'*, which may be vertically oriented at the bending or folding portion of the retardation film R', may be inclined with respect to the Z-axis. Therefore, a major axis M' of the vertical liquid crystal molecules 410*l'*, which are vertically oriented at the bending or folding portion of the retardation film R', may be inclined by an angle +θ' with respect to the X-axis. Accordingly, since the orientation state of the vertical liquid crystal molecules 410*l'* when viewed from the side direction S' may be different than the orientation state of the vertical liquid crystal molecules 410*l'* when viewed from the front direction F', a color shift as illustrated in the graph of FIG. 6B may be generated according to the viewing angles when the flexible display apparatus is bent or folded.

FIG. 6B illustrates the brightness variations according to the viewing angles of the flexible display apparatus of FIG. 5B according to a comparative example. Brightness of the flexible display apparatus may decrease according to a color distribution as illustrated at the right side of FIG. 6B from a blue color to a red color. A horizontal axis represents viewing angles from about 0 degree to above about 70 degrees. Referring to FIG. 6B, a brightness value may become lower than that of FIG. 5B at about 70 degree of the viewing angle although the brightness value of FIG. 6B is similar to the graph of FIG. 5B. Moreover, a low brightness region of FIG. 6B becomes narrower than a low brightness region of FIG. 5B in entire measured regions of the display apparatus. Accordingly, a color shift according to variation of viewing angles in the retardation film R' as the comparative example may occur in the comparative example as illustrated in FIGS. 6A and 6B.

Figure 7:
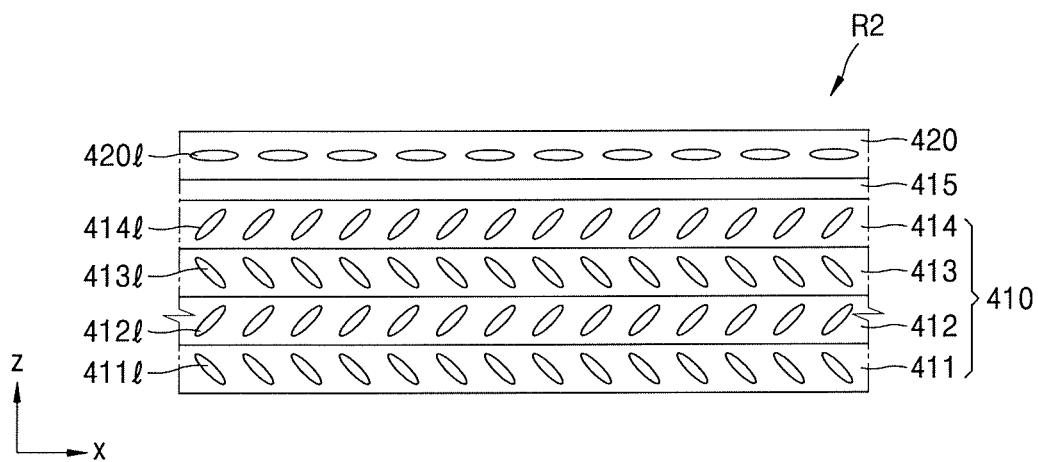
FIG. 7 is a cross-sectional view illustrating a retardation film according to an exemplary embodiment of the present invention.
Figure 8:
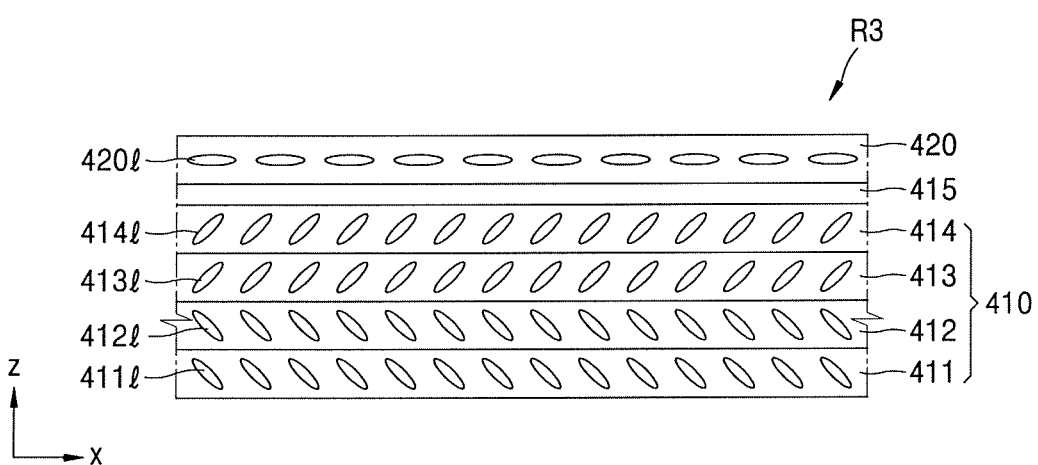
FIG. 8 is a cross-sectional view illustrating a retardation film according to an exemplary embodiment of the present invention.

FIG. 7 is a cross-sectional view illustrating a retardation film R2 according to an exemplary embodiment of the present invention. FIG. 8 is a cross-sectional view illustrating a retardation film R3 according to an exemplary embodiment of the present invention. In the exemplary embodiments of the present invention as illustrated in FIGS. 7 and 8, the retardation film R2 and the retardation film R3 may be similar to the retardation film R1 of FIG. 5A. However, the stacking number of tilt +C plates is four. Therefore, a difference between the retardation film R1 and the retardation film R2 and the retardation film R3 will be described in detail hereinafter.

Referring to FIG. 7, the retardation film R2 may include a tilt +C plate layer 410. The retardation film R2 may further include a +A plate layer 420. The +A plate layer 420 may be disposed over the tilt +C plate layer 410. The tilt +C plate layer 410 may include a first tilt +C plate 411, a second tilt +C plate 412, a third tilt +C plate 413, and a fourth tilt +C plate 414. The first tilt +C plate 411, the second tilt +C plate 412, the third tilt +C plate, and the fourth tilt +C plate 414 may be arranged in a stacking order. Accordingly, when the number of stacking tilt +C plates is 2m with m as a positive integer, m is two.

The first tilt +C plate 411 and the third tilt +C plate 413 may include first liquid crystal molecules 411*l* and third liquid crystal molecules 413*l*, respectively. The first liquid crystal molecules 411*l* and the third liquid crystal molecules 413*l* may each include a major axis which is inclined by an angle in a counterclockwise or clockwise direction with respect to the Z-axis. The second tilt +C plate 412 and the fourth tilt +C plate 414 may include second liquid crystal molecules 412*l* and fourth liquid crystal molecules 414*l*, respectively. The second liquid crystal molecules 412*l* and the fourth liquid crystal molecules 414*l* may each include a major axis which is inclined by an angle in a clockwise or counterclockwise direction with respect to the Z-axis. Therefore, the tilt +C plate layer 410 may have a stacked structure in which a liquid crystal layer oriented in a counterclockwise direction with respect to the Z-axis and a liquid crystal layer oriented in a clockwise direction with respect to the Z-axis are alternately stacked. The major axes of liquid crystal molecules of the adjacent liquid crystal layers may be substantially symmetrical to each other with respect to the X-axis. For example, the major axis of the first liquid crystal molecules 411*l* and the second liquid crystal molecules 412*l* and the major axis of third liquid crystal molecules 413*l* and the fourth liquid crystal molecules 414*l* may be substantially symmetrical to each other with respect to the X-axis.

Accordingly, a negative (−) angle defined by the major axis of the first liquid crystal molecules 411*l* and the third liquid crystal molecules 413*l* with respect to the X-axis may be compensated by a positive (+) angle defined by the major axis of the second liquid crystal molecules 412*l* and the fourth liquid crystal molecules 414*l*. Since this compensation may be effective at a bending or folding portion of the retardation film R2, an overlapping orientation state of the first, second, third, and fourth liquid crystal molecules 411*l*, 412*l*, 413*l*, and 414*l*, viewed from a side direction, and an overlapping orientation state of the first, second, third, and fourth liquid crystal molecules 411*l*, 412*l*, 413*l*, and 414*l*, viewed from a frontal direction may be substantially the same as or similar to each other. Therefore, a color shift, which may be caused by variation of the viewing angles, may be reduced.

Referring to FIG. 8, the retardation film R3 may be similar to the retardation film R2 of FIG. 7. However, a stacking order of the tilt +C plates may differ.

The first tilt +C plate 411 may include first liquid crystal molecules 411*l*. The second tilt +C plate 412 may include second liquid crystal molecules 412*l*. The first liquid crystal molecules 411*l* and the second liquid crystal molecules 412*l* may include a major axis which is inclined by an angle in a counterclockwise or clockwise direction with respect to the Z-axis. The third tilt +C plate 413 may include third liquid crystal molecules 413*l*. The fourth tilt +C plate 414 may fourth liquid crystal molecules 414*l*. The third liquid crystal molecules 413*l* and the fourth liquid crystal molecules 414*l* may include a major axis which is inclined by an angle in a clockwise or counterclockwise direction with respect to the Z-axis. Accordingly, the tilt +C plate layer 410 may have a stack structure. The stack structure of the tilt +C plate layer 410 may include two liquid crystal layers oriented in a counterclockwise direction with respect to the Z-axis at a lower portion thereof and two liquid crystal layers oriented in a clockwise direction with respect to the Z-axis at an upper portion thereof. The two liquid crystal layers oriented in the counterclockwise direction with respect to the Z-axis and the two liquid crystal layers oriented in a clockwise direction with respect to the Z-axis may be stacked. The major axes of the first liquid crystal molecules 411*l* may be substantially parallel to the major axes of the second liquid crystal molecules 412*l*. The major axes of the third liquid crystal molecules 413*l* may be substantially parallel to the major axes of the fourth liquid crystal molecules 414*l*. Moreover, the major axis of the first liquid crystal molecules 411*l* may be substantially symmetrical to the major axis of the second liquid crystal molecules 412*l* with respect to the X-axis. The major axis of the third liquid crystal molecules 413*l* may be substantially symmetrical to the major axis of the fourth liquid crystal molecules 414*l* with respect to the X-axis.

Accordingly, a negative (−) angle defined by the major axis of the first liquid crystal molecules 411*l* and the second liquid crystal molecules 412*l* with respect to the X-axis may be compensated by a positive (+) angle defined by the major axis of the third liquid crystal molecules 413*l* and the fourth liquid crystal molecules 414*l*. Therefore, this compensation effect may prevent generation of a color shift, which may be caused by a variation of the viewing angles.

Various combinations of the tilt +C plates may be used when a sum of angles defined by the major axes of the liquid crystal molecules included in each of the liquid crystal layers is about zero. When the number of tilt +C plates is 2m with m as a positive integer, m may be any positive integer if a direction in which m tilt +C plates are inclined with respect to the Z-axis is opposite to a direction in which the remaining m tilt +C plates are inclined with respect to the Z-axis. If a value of m becomes substantially large, an entire thickness of the tilt +C plates may become excessively large. As such, the retardation film might not be used in the flexible display apparatus due to an excessively large entire thickness of the tilt +C plates. Therefore, the value of m may be limited.

Figure 9:
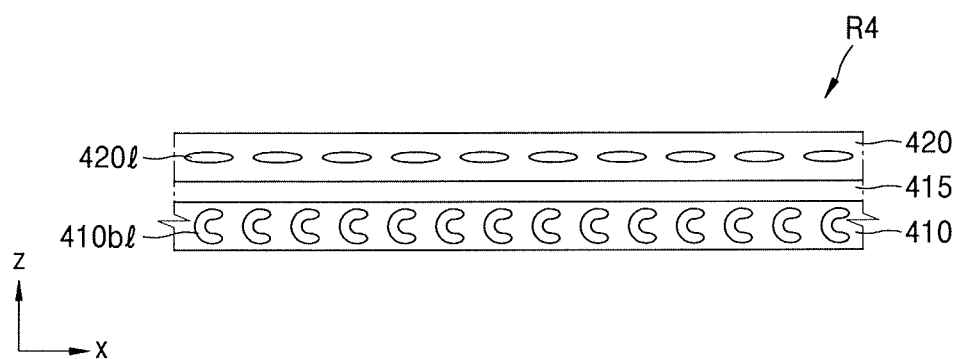
FIG. 9 is a cross-sectional view illustrating a retardation film according to an exemplary embodiment of the present invention.
Figure 10:
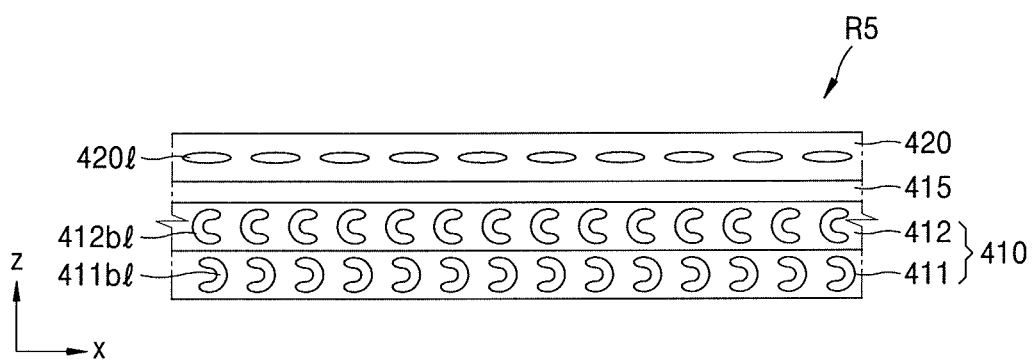
FIG. 10 is a cross-sectional view illustrating a retardation film according to an exemplary embodiment of the present invention.

FIG. 9 is a cross-sectional view illustrating a retardation film R4 according to an exemplary embodiment of the present invention. FIG. 10 is a cross-sectional view illustrating a retardation film R5 according to an exemplary embodiment of the present invention.

Referring to FIG. 9, the retardation film R4 may include a tilt +C plate layer 410. The retardation film R4 may further include a +A plate layer 420. The +A layer 420 may be disposed over the tilt +C plate layer 410. A second adhesive layer 415 may be disposed between the tilt +C plate layer 410 and the +A plate layer 420. The tilt +C plate layer 410 may include a tilt +C plate. The tilt +C plate may include a liquid crystal layer. The liquid crystal layer may include having C-shaped liquid crystal molecules 410*bl*.

The C-shaped liquid crystal molecules 410*bl* may be liquid crystal molecules having a bending shape similar to the letter "C". Since the C-shaped liquid crystal molecules 410*bl* are bent, the C-shaped liquid crystal molecules internally have polarity. Since the C-shaped liquid crystal molecules 410*bl* may have internal polarity and chirality, the C-shaped liquid crystal molecules 410*bl* may form a liquid crystal layer having a ferroelectric characteristic and a high response speed, which may display a high quality image.

The C-shaped liquid crystal molecules 410*bl* may be vertically oriented in the tilt +C plate layer 410. The C-shaped liquid crystal molecules 410*bl* may have a shape bending in the X-axis direction as illustrated in FIG. 9. Therefore, directions of polarities of the C-shaped liquid crystal molecules 410*bl* may be substantially parallel to the X-axis. Although FIG. 9 illustrates that the C-shaped liquid crystal molecules 410*bl* have a shape bending in the +X-axis direction, the C-shaped liquid crystal molecules 410*bl* have a shape bending in the −X-axis direction. Additionally, the C-shaped liquid crystal molecules 410*bl* may have a linearly symmetrical shape with respect to a center line of the C-shaped liquid crystal molecules 410*bl*, which is extended parallel to the X-axis, as an axis of symmetry. However, a shape of the C-shaped liquid crystal molecules 410*bl* is not limited to a C shape. The C-shaped liquid crystal molecules 410*bl* may have various shapes, for example, a V shape, if the shape is a linearly symmetrical shape with respect to a line parallel to the X-axis.

According to an exemplary embodiment of the present invention, the C-shaped liquid crystal molecules 410*bl* may have a shape similar to a connection of the first liquid crystal molecule 411 and the second liquid crystal molecule 412 as illustrated in FIGS. 3 and 5A. Accordingly, similarly to the retardation film R1 of FIG. 5A, an orientation state of the C-shaped liquid crystal molecules 410*bl* viewed from a side direction and an orientation state of the C-shaped liquid crystal molecules 410*bl* viewed from a frontal direction, may be substantially the same as or similar to each other when the retardation film R4 is bent or folded. Therefore, a flexible display apparatus including the retardation film R4 may prevent a color shift caused by variation of viewing angles.

The +A plate layer 420 disposed over the tilt +C plate layer 410 may include a +A plate. The +A plate may be a quarter-wave plate, i.e., a λ/4 plate. The quarter-wave plate may have a reverse wavelength dispersion characteristic similarly to previously described exemplary embodiments of the present invention. The +A plate may include a liquid crystal layer. The liquid crystal layer may be horizontally oriented to be substantially parallel to the X-axis.

Referring to FIG. 10, the retardation film R5 may include a first tilt +C plate 411 and a second tilt +C plate 412. The first tilt +C plate 411 and the second tilt +C plate 412 may include liquid crystal molecules. The liquid crystal molecules of the second tilt +C plate 412, second C-shaped liquid crystal molecules 412*bl*, may bend in a direction opposite the liquid crystal molecules of the first tilt +C plate 411, first C-shaped liquid crystal molecules 411*bl*.

The tilt +C plate layer 410 of the retardation film R5 may include the first tilt +C plate 411. The tilt +C plate layer 410 of the retardation film R5 may further include the second tilt +C plate 412.

According to an exemplary embodiment of the present invention, the first tilt +C plate 411 may include the first C-shaped liquid crystal molecules 411*bl*. The first C-shaped liquid crystal molecules may have a shape bending in a −X direction. The second tilt +C plate 412 may include the second C-shaped liquid crystal molecules 412*bl*. The second C-shaped liquid crystal molecules 412*bl* may have a shape bending in a +X direction. Alternatively, according to an exemplary embodiment of the present invention, the first C-shaped liquid crystal molecules 410*bl* may have a shape bending in a +X direction. The second C-shaped liquid crystal molecules 412*bl* may have a shape bending in a −X direction.

Since the bending directions of the first C-shaped liquid crystal molecules 410*bl* and the second C-shaped liquid crystal molecules 412*bl* are opposite each other, the retardation film R4 may reduce a color shift. Furthermore, since polarity directions of the first C-shaped liquid crystal molecules 410*bl* and polarity directions of the second C-shaped liquid crystal molecules 412*bl* are offset, optical characteristics of the retardation film R5 may be increased.

Although FIG. 10 illustrates the tilt +C plate layer 410 including the first +C plate 411 and the second +C plate 412, exemplary embodiments of the present invention are not limited thereto. Therefore, when the number of tilt +C plates is 2m with m as a positive integer, m may be any positive integer as long as a bending direction of liquid crystal molecules of m tilt +C plates is opposite a bending direction of liquid crystal molecules of the remaining m tilt +C plates. However, if m is large, an entire thickness of the tilt +C plate layer 410 may become excessively large. Therefore, a tilt +C plate layer might not be suitable for a flexible display apparatus. Accordingly, m may be limited. Moreover, the tilt +C plates may be arranged to have high optical characteristic so that C-shaped liquid crystal molecules of adjacent layers may bend in opposite directions respective to each other.

According to exemplary embodiments of the present invention, when a display apparatus is bent or folded, a color shift caused by a viewing angle may be reduced due to a retardation film included in the display apparatus. Therefore, a flexible display apparatus capable of displaying high quality images may be formed.

It should be understood that exemplary embodiments of the present invention as described herein should be considered in as descriptive and not for purposes of limitation.

While one or more exemplary embodiments of the present invention have been described with reference to the figures, it will be understood by those of ordinary skill in the art that various changes in form and details may be made therein without departing from the spirit and scope of the present invention as defined by the following claims.

What is claimed is:

1. A retardation film, comprising:
a stacked structure comprising 2m tilt +C plates, wherein a +C plate is a positive C-plate, each of the 2m tilt +C plates comprising a liquid crystal layer; and
a +A plate disposed over the 2m tilt +C plates, wherein
m is a positive integer,
a longitudinal direction axis of the retardation film is an X-axis,
a width direction axis of the retardation film substantially perpendicular to the X-axis is a Y-axis,
a thickness direction axis of the retardation film substantially perpendicular to the X-axis and the Y-axis is a Z-axis,
refractive indexes of the X-axis, the Y-axis, and the Z-axis respectively correspond to nx, ny, and nz, and
the liquid crystal layer includes a material satisfying nx≠ny<nz wherein an in-plane retardation value Rin is not 0 and a thickness retardation value Rth is a positive value.

2. The retardation film of claim 1, wherein:
the liquid crystal layer comprises liquid crystal molecules having a major axis inclined with respect to the Z-axis; and
major axes of the liquid crystal molecules of one half of the 2m tilt +C plates and major axes of the liquid crystal molecules of the other half of 2m tilt +C plates are substantially symmetrical to each other with respect to the X-axis.

3. The retardation film of claim 1, wherein the liquid crystal layer comprises a coating layer having an orientation inclined with respect to the Z-axis.

4. The retardation film of claim 1, wherein the +A plate comprises a horizontal liquid crystal layer having an orientation substantially parallel to the X-axis.

5. The retardation film of claim 1, wherein
the +A plate comprises a quarter-wave plate.

6. The retardation film of claim 1, wherein
the +A plate includes reverse wavelength dispersion.

7. A retardation film, comprising:
at least one tilt +C plate comprising a liquid crystal layer, the liquid crystal layer comprising C-shaped liquid crystal molecules, wherein a +C plate is a positive C-plate; and
a +A plate disposed over the at least one tilt +C plate, wherein a longitudinal direction axis of the retardation film is an X-axis, a width direction axis of the retardation film substantially perpendicular to the X-axis is a Y-axis, a thickness direction axis of the retardation film substantially perpendicular to the X-axis and the Y-axis is a Z-axis, refractive indexes of the X-axis, the Y-axis, and the Z-axis respectively correspond to nx, ny, and nz, and the liquid crystal layer includes a material satisfying nx≠ny<nz wherein an in-plane retardation value Rin is not 0 and a thickness retardation value Rth is a positive value.

8. The retardation film of claim 7, wherein
the C-shaped liquid crystal molecules have a shape bending in a direction of the X-axis.

9. The retardation film of claim 7, wherein
the C-shaped liquid crystal molecules have a linearly symmetrically shape with respect to an axis of symmetry defined as a center line of the C-shaped liquid crystal molecules and extending substantially parallel to the X-axis.

10. The retardation film of claim 7, wherein:
the at least one tilt +C plate comprises a stacked structure comprising 2m+C tilt plates, wherein m is a positive integer; and a bending direction of the C-shaped liquid crystal molecules of the m plates are opposite to a bending direction of the C-shaped liquid crystal molecules of the remaining m plates.

11. The retardation film of claim 7, wherein
the +A plate comprises a horizontal liquid crystal layer having an orientation substantially parallel to the X-axis.

12. The retardation film of claim 7, wherein
the +A plate comprises a quarter-wave plate.

13. The retardation film of claim 7, wherein
the +A plate includes reverse wavelength dispersion.

14. A display apparatus, comprising:
a substrate;
a display unit disposed over the substrate, the display unit being bendable or foldable and comprising a plurality of organic light-emitting elements;
a polarization film disposed over the display unit; and
the retardation film of claim 1, the retardation film disposed between the display unit and the polarization film.

15. The display apparatus of claim 14, wherein
when the display unit is in a bent or a folded state,
the display unit has a convex shape in a light-emitting direction of the organic light-emitting elements.

16. The display apparatus of claim 14, wherein
when a portion of the display unit is in a bent or folded state,
a curvature center of the bent or folded portion of the display unit is closer to the display unit than the polarization film.

17. The display apparatus of claim 14, wherein the 2m tilt +C plates are disposed over the display unit and m is a positive integer.

18. A display apparatus, comprising:
a substrate;
a display unit disposed over the substrate, the display unit being bendable or foldable and comprising a plurality of organic light-emitting elements;
a polarization film disposed over the display unit; and
a retardation film, the retardation film comprising:
at least one tilt +C plate comprising a liquid crystal layer, the liquid crystal layer comprising C-shaped liquid crystal molecules, wherein a +C plate is a positive C-plate; and
a +A plate disposed over the at least one tilt +C plate,
wherein
a longitudinal direction axis of the retardation film is an X-axis,
a width direction axis of the retardation film substantially perpendicular to the X-axis is a Y-axis,
a thickness direction axis of the retardation film substantially perpendicular to the X-axis and the Y-axis is a Z-axis,
refractive indexes of the X-axis, the Y-axis, and the Z-axis respectively correspond to nx, ny, and nz, and
the liquid crystal layer includes a material satisfying nx≠ny<nz wherein an in-plane retardation value Rin is not 0 and a thickness retardation value Rth is a positive value.

19. The display apparatus of claim 18, wherein
the at least one tilt +C plate is disposed over the display unit.

20. The display apparatus of 18, wherein
when the display unit is in bent or folded state,
the display unit has a convex shape in a light-emitting direction of the organic light-emitting elements.

21. The display apparatus of claim 18, wherein
a curvature center of a bent or folded portion of the display unit is closer to the display unit than the polarization film.

22. The display apparatus of claim 18, wherein
the retardation film is disposed between the display unit and the polarization film.

* * * * *